US005802687A

United States Patent [19]

Thiel et al.

[11] Patent Number: 5,802,687

[45] Date of Patent: Sep. 8, 1998

[54] METHOD OF MANUFACTURING AN INK JET PRINT HEAD

[75] Inventors: Wolfgang Thiel; Stephan Günther, both of Berlin, Germany

[73] Assignee: Francotyp-Postalia AG & Co., Birkenwerder, Germany

[21] Appl. No.: 963,174

[22] Filed: Nov. 3, 1997

Related U.S. Application Data

[60] Continuation of Ser. No. 449,434, May 24, 1995, abandoned, which is a division of Ser. No. 101,449, Aug. 2, 1993, Pat. No. 5,592,203.

[30] Foreign Application Priority Data

Jul. 31, 1992 [DE] Germany .......................... 42 25 799.9

[51] Int. Cl.[6] ................................ B41J 2/01; H01L 41/22

[52] U.S. Cl. .......................... 29/25.35; 29/890.1; 216/27; 347/40; 347/70

[58] Field of Search ............................... 29/25.35, 890.1; 216/2, 27, 47; 310/368; 347/40, 54, 64, 70, 71, 72, 76

[56] References Cited

U.S. PATENT DOCUMENTS

| | | | |
|---|---|---|---|
| 4,092,166 | 5/1978 | Olsen et al. | 430/323 |
| 4,216,477 | 8/1980 | Matsuda et al. | 347/47 |
| 4,251,820 | 2/1981 | Humenik | 347/76 |

(List continued on next page.)

FOREIGN PATENT DOCUMENTS

| | | |
|---|---|---|
| 0 013 095 | 7/1980 | European Pat. Off. . |
| 0 067 653 | 12/1982 | European Pat. Off. . |
| 0 067 889 | 12/1982 | European Pat. Off. . |
| 0 090 663 | 10/1983 | European Pat. Off. . |
| 0 326 804 | 8/1989 | European Pat. Off. . |
| 0 326 568 | 8/1990 | European Pat. Off. . |
| 0 486 256 | 5/1992 | European Pat. Off. . |

(List continued on next page.)

OTHER PUBLICATIONS

Patent Abstract of Japan No. JP 59–229347 (Kawamura) Dec. 22, 1984.

Patent Abstract of Japan No. JP 2–92644 (Narita) Apr. 3, 1990.

Patent Abstract of Japan No. JP 61–225060 (Yamada), Oct. 6, 1986.

Print Engine Design Publ., First Annual Ink Printig Workshop, Mar. 25–27, 1992 "Utilizing Impulse Ink . . . ".

IBM Techn.Discl.Bulletin vol. 20,No. 3,Aug. 1977, pp. 1193–1195, "Wafer Sepration Into Nozzle Plates by . . . ".

*Primary Examiner*—Peter Vo
*Attorney, Agent, or Firm*—Herbert L. Lerner; Laurence A. Greenberg

[57] ABSTRACT

An edge-shooter type ink jet print head and a method of its manufacture are disclosed. The print head includes members into which chambers are formed which, in turn, are equipped with devices for ejecting ink from each chamber to respectively assigned ink nozzles. A group of chambers is formed in each chamber-carrying member, on a side facing a center member. A single row of ink nozzles includes k nozzle groups which are respectively assigned to k ink chamber groups and which are formed along an edge face of a first chamber-carrying member. The first nozzle group of the k nozzle groups communicates with the chamber group formed in the first chamber-carrying member. The other k-1 nozzle groups are assigned to respective ones of the other (k-1) chamber groups. The chamber groups are supplied with ink from suction chambers and lie in further chamber-carrying members which are vertically offset relative to one another. In a method of manufacturing the ink jet print head, a pretreatment of the plate material from which the print head is made is followed by masking and etching the plates. All of this is done during a parallel plate processing step. Individual completed components are affixed to one another and bonded together as a print head module.

33 Claims, 9 Drawing Sheets

U.S. PATENT DOCUMENTS

| | | | |
|---|---|---|---|
| 4,394,670 | 7/1983 | Sugitani et al. | 347/65 |
| 4,412,224 | 10/1983 | Sugitani | 347/64 X |
| 4,434,430 | 2/1984 | Koto | 347/70 |
| 4,525,728 | 6/1985 | Koto | 347/70 |
| 4,536,097 | 8/1985 | Nilsson | 29/890.1 X |
| 4,609,427 | 9/1986 | Inamoto et al. | 216/27 |
| 4,680,595 | 7/1987 | Cruz-Uribe et al. | 347/40 |
| 4,703,333 | 10/1987 | Hubbard | 347/40 |
| 4,752,788 | 6/1988 | Yasuhara et al. | 347/68 |
| 4,769,654 | 9/1988 | Tanaka et al. | 347/40 |
| 4,897,903 | 2/1990 | Johannsen | 29/25.35 |
| 4,905,017 | 2/1990 | Sugitani et al. | 347/65 |
| 4,940,996 | 7/1990 | Paton et al. | 347/69 X |
| 5,028,514 | 7/1991 | Johannsen | 430/323 X |
| 5,062,937 | 11/1991 | Komuro | 347/64 X |
| 5,072,241 | 12/1991 | Shibaike et al. | 347/54 |
| 5,141,596 | 8/1992 | Hawkins et al. | 216/27 X |
| 5,265,315 | 11/1993 | Hoisington et al. | 29/25.35 |
| 5,500,988 | 3/1996 | Moynihan et al. | 29/25.35 |

FOREIGN PATENT DOCUMENTS

| | | |
|---|---|---|
| 0 575 204 | 12/1993 | European Pat. Off. . |
| 0 581 395 | 2/1994 | European Pat. Off. . |
| 2 349 555 | 11/1974 | Germany . |
| 26 49 970 | 5/1978 | Germany . |
| 27 52 378 | 6/1978 | Germany . |
| 29 18 737 | 11/1979 | Germany . |
| 32 00 388 | 12/1982 | Germany . |
| 32 22 133 | 12/1982 | Germany . |
| 32 48 087 | 7/1983 | Germany . |
| 34 45 761 | 6/1985 | Germany . |
| 37 10 654 | 10/1988 | Germany . |
| 38 03 432 | 8/1989 | Germany . |
| 38 05 279 | 8/1989 | Germany . |
| 38 14 720 | 11/1989 | Germany . |
| 33 22 647 | 3/1990 | Germany . |
| 31 50 109 | 2/1991 | Germany . |
| 40 25 193 | 2/1992 | Germany . |
| 42 07 626 | 9/1993 | Germany . |
| 42 25 799 | 2/1994 | Germany . |
| 63-28657 | 2/1988 | Japan . |
| 620 662 | 12/1980 | Sweden . |
| 1 416 980 | 12/1975 | United Kingdom . |
| 92/09111 | 5/1992 | WIPO . |

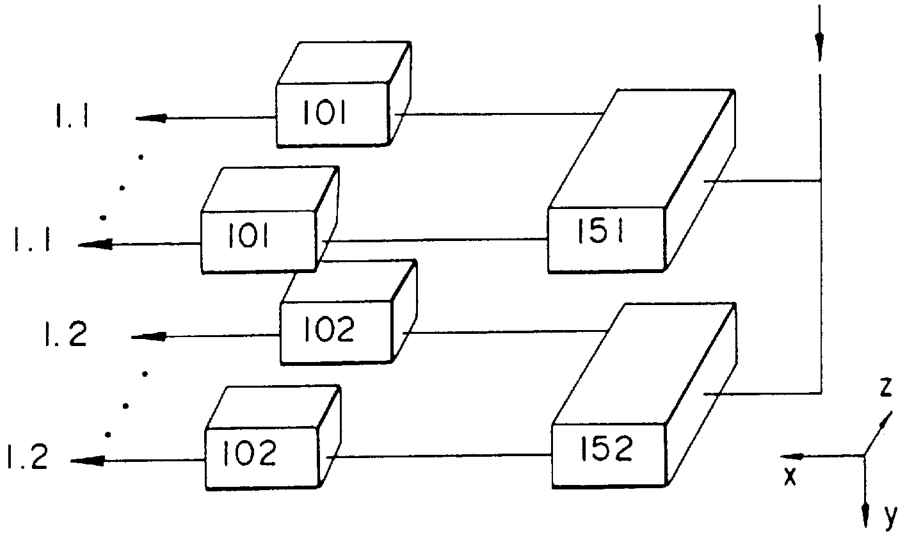
PRIOR ART Fig. 1a
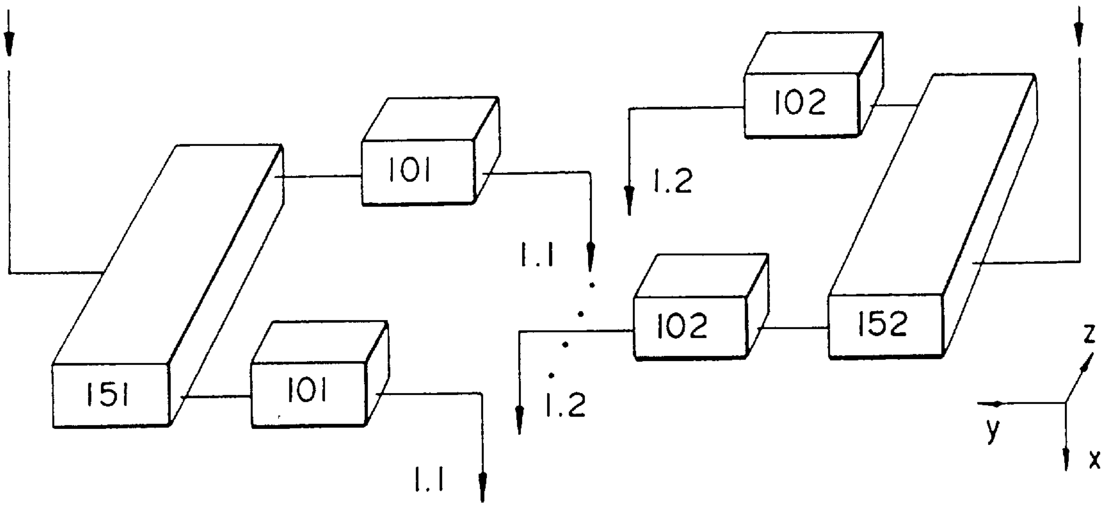
PRIOR ART Fig. 1b

Fig. 5a
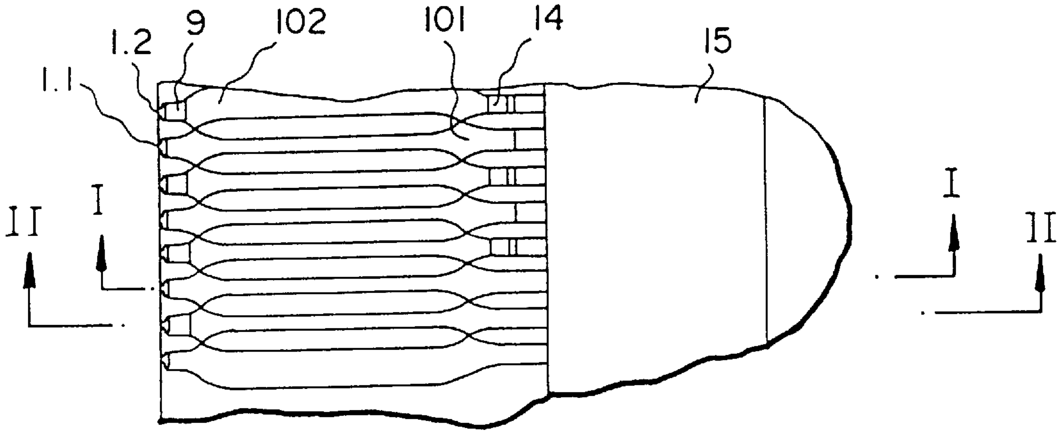
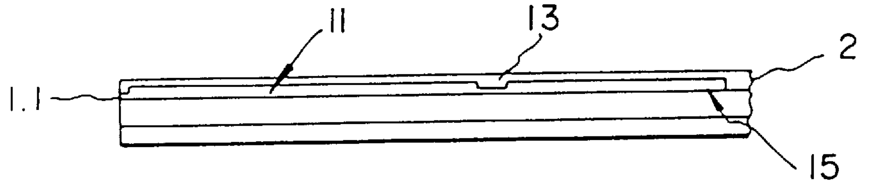
Fig. 5b
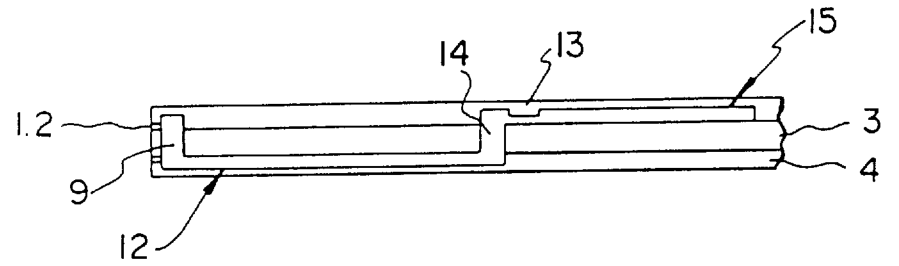
Fig. 5c

METHOD OF MANUFACTURING AN INK JET PRINT HEAD

CROSS-REFERENCE TO RELATED APPLICATION

This application is a continuation of application Ser. No. 08/449,434, filed on May 24, 1995 now abandoned, which was a divisional of application Ser. No. 08/101,449, filed Aug. 2, 1993 now U.S. Pat. No. 5,592,203.

BACKGROUND OF THE INVENTION

1. Field of the Invention

This invention relates to ink jet print heads, and in particular to an edge-shooter ink jet in-line print head, and a method for manufacturing the print head. Print heads of this kind are preferably used in small, fast printers as they are utilized, for instance, in franking machines for franking postal matter.

2. Description of the Related Art

Ink jet print heads built on the edge-shooter or face-shooter principles (First Annual Ink Jet Printing Workshop, Mar. 26–27, 1992, Royal Sonesta Hotel, Cambridge, Mass.) are known in the art.

So far, efforts have been made to minimize chamber dimensions in an effort to increase nozzle density. Also, nozzle chambers have been arranged concentrated to the face edge. However, this principle is useful only for ink jet modules with few nozzles in one row and not when there is a high number of nozzles or a high packing density.

In a first generation of ink jet print heads, the same were built according to the edge-shooter principle of single impulse jets which comprise an elongated ink chamber with a rectangular cross-section and a piezo crystal located thereabove (BIS CAP Ink Jet Printing Conference, Monterey, Calif., Nov. 11–13, 1991).

In a later generation, a nozzle panel was disposed in front of a one piece ink jet print head with several chambers. In that case, the chambers do not lie in parallel and side by side with the smaller chamber surface but with the larger chamber surface. Piezo crystals thereby form the chamber walls. This is referred to as the "shared wall concept" (Ink Jet Printing Conference, Nov. 11–13, 1991).

German patent No. DE 34 45 761 A1 discloses a process for manufacturing a transducer arrangement from a single plate of a transducer material. After coating the lower plate surface with a membrane layer, a removal of material from the upper surface follows, creating separated areas arranged on the membrane above each pressure chamber (area 25.4 mm by 2.54 mm). It is no longer necessary to provide an adhesive connection between the transducer material and the membrane, with the regularity of all distances and spacings being improved. The resulting nozzle distance, however, becomes comparatively large.

Moreover, from U.S. Pat. No. 4,680,595 to Cruz-Uribe et al., a face-shooter type print head which has a doubled nozzle density with two groups of ink chambers is known. Each print chamber is rectangular in cross section and includes a supply channel and a nozzle as well as an oscillation plate with a piezo-ceramic element. However, this print head is disadvantageous in that pressure waves occurring in the ink supply and in each chamber can result in a spillover to other pressure chambers. This spillover may only be eliminated by providing for extensive supplementary safeguards. Another disadvantage is that these ink jet print heads must be manufactured in an expensive large-scale manufacturing process.

From U.S. Pat. No. 4,703,333 to David Hubbard, it is known to produce an ink jet print head from a number of face-shooter modules which are diagonally staggered, one on top the other, resulting in a configuration which is inclined towards the surface of a recording medium. Ink jet print heads having such an inclined configuration produce a constant recording even if the thickness of the recording medium varies. However, production of such print heads requires a multitude of process steps and it is difficult to guarantee in a large-scale process the accuracy required for each print head arrangement. The electrical control for these print heads during use is a further difficulty.

The doubled nozzle density in one row obtained with the face-shooter ink jet module, which has two groups of ink chambers arranged symmetrically with regard to the nozzle row has not been, up to now, obtainable with edge-shooter ink jet modules having one nozzle row. For edge-shooter ink jet modules, several nozzle rows are typically arranged both horizontally and vertically staggered in order to obtain double mapping density.

A staggered configuration of two rows of nozzles in an edge-shooter module is known (First annual ink jet printing workshop, Mar. 26–27, 1992, Royal Sonesta Hotel, Cambridge, Mass.). The module usually consists of only three members in total, typically made from glass, namely a center member with openings and two side parts each having one row of ink chambers and a nozzle row at respective edges of the side members. The two rows of ink chambers and nozzles are offset relative to one another, and consequently possess the disadvantages already mentioned with respect to module assembly and electrical control.

These disadvantages are further aggravated in an ink print head comprising several of these modules. It is important, in this respect, that the staggering of individual nozzle rows be exactly the same. Furthermore, each module had to be connected to an ink storage tank via separate ink supply conduits and filters.

In the staggered configuration of two rows, of which each have a low nozzle density, the minimum spacing between adjacent nozzles in each row may not be reduced more than the minimum size required for the ink chambers.

Due to manufacturing process limitations, it is impossible to obtain a steady nozzle size for all nozzles, because channels are etched into several individual glass parts. Even minor differences in size or material can result in deviations of nozzle shape or position.

It is accordingly an object of the invention to provide an ink jet print head and a method for manufacturing the same, which overcome the hereinafore-mentioned disadvantages of the heretofore-known devices and methods of this general type and to provide an ink jet print head with a high nozzle density per row and a manufacturing process for the print head with low production costs.

SUMMARY OF THE INVENTION

With the foregoing and other objects in view there is provided, in accordance with the invention, an ink jet print head of the edge-shooter type, which comprises:

first and second chamber-carrying members each having a plurality of ink chambers for receiving ink formed in a flat surface thereof, and the first chamber-carrying member having nozzle openings formed therein each being assigned to a respective one of the ink chambers;

a center member disposed between the flat surfaces of the first and second chamber-carrying members;

means for supplying ink to the ink chambers and for ejecting ink from the ink chambers through the nozzles;

the nozzles formed in the first chamber-carrying member forming a single nozzle row having k nozzle groups and extending in a first direction, the ink chambers having k chamber groups with each of the nozzle groups being associated with a respective one of the chamber groups; where k≧2;

the ink chambers formed in the first chamber-carrying part being a first chamber group and the ink chambers formed in the second chamber-carrying member being a k-1th chamber group, a first nozzle group of the k nozzle groups communicating with the first chamber group, and a k-1th nozzle group of the k nozzle groups communicating with the k-1th chamber group;

the nozzle openings extending and ejecting ink droplets in a second direction being substantially orthogonal to the first direction, the k chamber groups being disposed in a third direction relative to one another, the third direction being substantially orthogonal to the first and second direction;

the center member having communication openings formed therein, the communication openings being associated and cooperating with the ink supplying means for supplying the k-1th nozzle group in the nozzle row with ink.

The surfaces of the chamber-carrying members in which the ink chambers are formed each face the center member. The respectively orthogonal directions, i.e. the first, second and third directions may be described in a cartesian system with x, y and z directions.

With the above-noted and other objects in view, there is also provided, in accordance with the invention, a method of manufacturing an ink jet print head which comprises the steps of: processing plate material in parallel, i.e. simultaneously, and forming through openings in all members to be equipped with through openings; forming chamber-carrying members; connecting the members and forming at least one print head module, and subsequently annealing the at least one print head module; applying piezo-electrical elements to the at least one module and connecting the piezo-electrical elements with conductor paths applied to the module; and assembling the at least one module to form an ink jet print head.

In other words, the method may be broadly described as parallel plate processing in production of through openings in all parts, special processing of chamber-carrying parts, arranging the components as at least one module with subsequent annealing, applying and bonding the piezo-electrical elements with applied conductor paths, and assembling as the print head.

Based on an objective to produce ink jet print heads with an arrangement inclined towards the surface of a recording medium to generate a steadier recording even if the thickness of the recording medium varies, an ink jet print head having an in-line module with edge-ejection of ink droplets is preferred.

The invention proceeds on the recognition that, with the principle of edge-ejection, the nozzle row with a high number of nozzles, may be formed in a side part or component of a print head module. For the first time, a higher nozzle density, completely independent of the ink chamber dimensions, may now be achieved.

In fact, the ink chamber dimensions may even be increased without decreasing the nozzle density.

In addition to the increased nozzle density, the print head according to the invention provides a number of further advantages. In the following, the print head according to the invention will be referred to as the Edge-Shooter-Ink-Jet-In-Line print head or the ESIJIL print head.

By having all of the nozzles formed in one and the same glass part, it is possible to obtain a steady nozzle size and steady spacing between all nozzles. This is due to the fact that respective channels for the nozzles are etched into the same glass part. That part forms the side member or lateral member of the print head module, before a diffusion bonding process takes place. Due to the fact that nozzle openings need be formed only in one member, manufacturing costs are logically reduced.

In contrast with conventional edge-shooter print head configuration, in which two rows of nozzles are horizontally aligned, an overlapping of the chamber-carrying members (each carrying a group of laterally offset ink chambers) is possible with a much greater machining tolerance.

A vertical alignment of the member with the ink nozzles and the chamber-carrying parts (each with a group of laterally offset chambers) is uncritical, as all nozzles are formed only on the one part of the print head module. This, again, reduces manufacturing costs.

The single nozzle row disposed at the edge facilitates disposing the print head in an inclined position relative to the recording medium.

Electrical control of the ink jet print head can be performed in a simpler way as compared to the prior art, because it is not necessary to compensate for the nozzle row spacing by chronologically offsetting print control signals.

In several embodiments of the invention, the ink jet print head may be formed of several modules, with only one module carrying the nozzle row. Alternatively, it may be formed of a module with several members. It is understood that a further advantage is obtained from the novel print head, in that the face edge of that member which has the nozzle row, may be disposed at a side or in the middle of a module.

The inventive method for manufacturing the ink jet print head is based on a print head configuration developed with a CAD (computer aided design) system, and mask production of a photo-sensitive glass plate.

The parts from which the individual members are formed are first sensitized with regard to the etchants which will be used in the etching process. In other words, those areas which are to be removed from the glass plate are first sensitzed. The masked glass plates are exposed at least once to a ultraviolet (UV) irradiation with ultraviolet light of appropriate wavelength. This is followed by a heat treatment.

In a parallel processing procedure, the sectors to be removed are removed from the plate (etched out). Then the components for the center member and the chamber-carrying member are separated.

Three components, including two chamber-carrying members and a center member or middle piece, are aligned relative to one another, attached to one another, and then annealed.

Finally, there follows a special treatment of the nozzle channels, the cavities (chambers) and the outer edge of the module, before the print head is electrically tapped and assembled.

Other features which are considered as characteristic for the invention are set forth in the appended claims.

Although the invention is illustrated and described herein as embodied in an ink jet print head and method for its manufacture, it is nevertheless not intended to be limited to the details shown, since various modifications and structural changes may be made therein without departing from the spirit of the invention and within the scope and range of equivalents of the claims.

Other features which are considered as characteristic for the invention are set forth in the appended claims.

Although the invention is illustrated and described herein as embodied in an ink jet print head and a method for its manufacture, or the edgeshooter ink jet in-line (ESIJIL) print head, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

BRIEF DESCRIPTION OF THE DRAWINGS

FIG. 1*a* is a schematic, three-dimensional block view of a prior art edge-shooter ink jet print head;

FIG. 1*b* is a similar view of a prior art face-shooter ink jet print head;

FIG. 5*a* is a partial, more detailed and magnified view of the ESIJIL print head of FIG. 4;

FIG. 5*b* is a sectional view taken along the line I—I of FIG. 5*a;*

FIG. 5*c* is a sectional view taken along line II—II of FIG. 5*a;*

DESCRIPTION OF THE PREFERRED EMBODIMENT

Figure 1C:
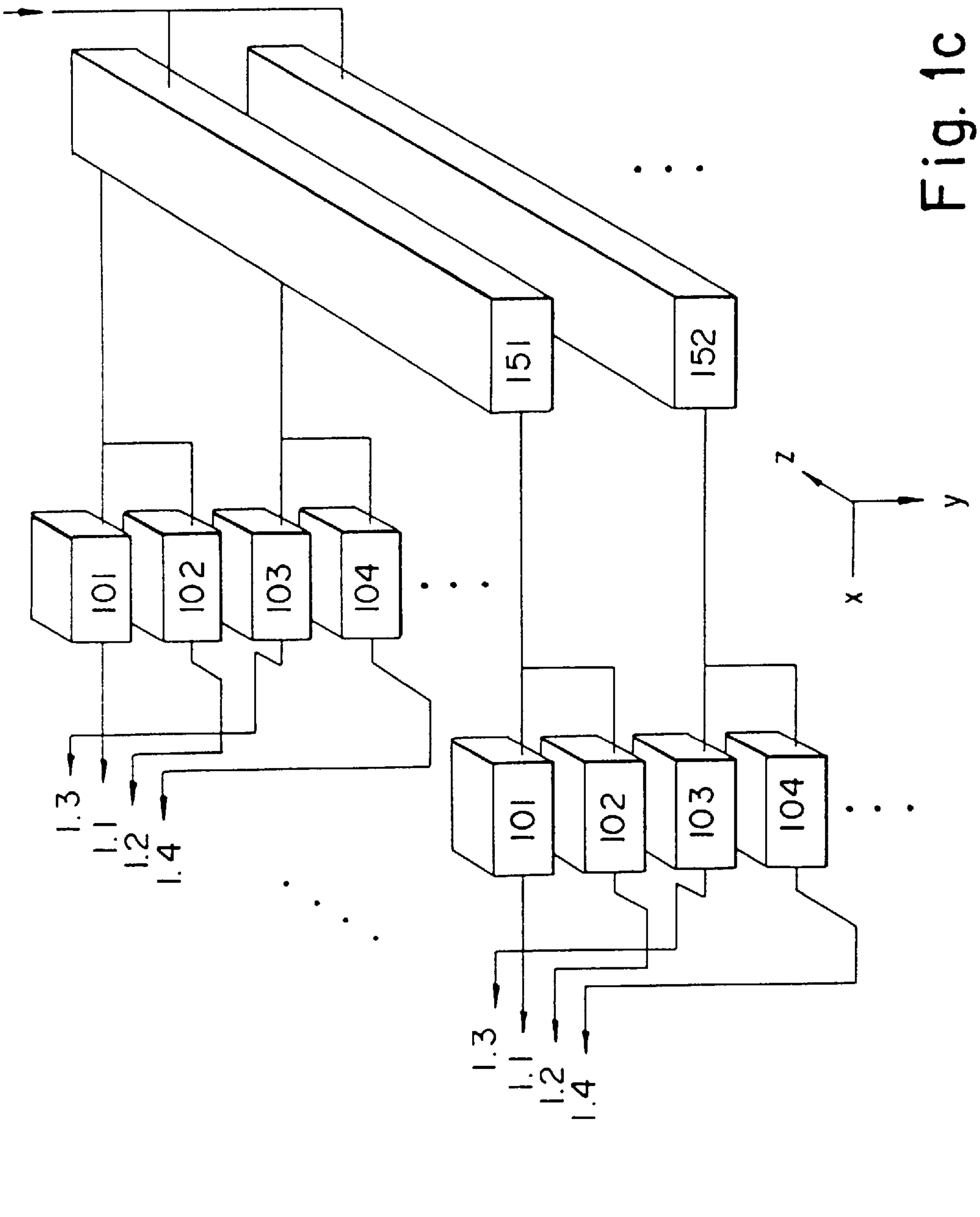
FIG. 1*c* is a similar view of an edge-shooter ink jet in-line (ESIJIL) print head in accordance with the invention.

The term "X-ray view" in the foregoing brief description of the drawings and in the following description refers to a two-dimensional projection through a body in which interior features are outlined and shaded which are not normally visible from the outside of the body.

Referring now to the figures of the drawing in detail and first, particularly, to FIG. 1*a* thereof, there is seen a perspective illustration of the well-known principles of an edge-shooter ink jet print head. The edge-shooter, in a modular configuration, includes an edge at which there lie two rows of nozzles 1.1 and 1.2. The nozzles 1.1 and 1.2 are vertically offset in the y-direction. As shown, a first group of ink chambers 101 are coupled to the group of nozzles 1.1 in the first row and a second group of ink chambers 102 are connected to the nozzles 1.2 of the second row.

FIG. 1*b* illustrates the well-known principles of a face-shooter ink jet print head. The modular configuration includes a base with a single row of nozzles formed from two groups of nozzles 1.1 and 1.2 which are horizontally disposed in an alternating fashion in the z-direction. A nozzle 1.1 is followed by a nozzle 1.2, which in turn is adjacent another nozzle 1.1, etc. Suction chambers 151 and 152 are operatively connected to respective groups of ink chambers 101 and 102 which in turn communicate with the two nozzle groups 1.1 and 1.2, respectively, for supplying ink thereto.

With reference to FIG. 1*c*, the print head according to the invention is referred to as an Edge-Shooter-Ink-Jet-In-Line (ESIJIL) print head. Its modular configuration includes a single row of nozzles formed along an edge thereof (i.e. print edge). The single row of nozzles is formed from $k \geqq 2$ nozzle groups 1.1, 1.2, etc., with the nozzles being disposed in a horizontal sequential order in the z-direction. The print head is configured such that flow from ink chamber groups 101–104 (where k=4) is guided to a first region of the print head in which the nozzles are disposed. That region forms a side part of the print head structure. The groups of ink chambers 101–104 are displaced in the y-direction. A conduit guides ink from each of the chambers 101–104 to the print edge, to the nozzles 1.1–1.4, which are disposed in one row and which are spaced apart with only small spacing therebetween.

In the embodiment illustrated in FIG. 1*c*, respective ink chambers of the groups 101–104 are in vertical alignment. The supply of ink to the nozzles is effected by staggering the guide channels in the z-direction. In another, non-illustrated embodiment, the chambers 101–104 themselves may be laterally offset in the z-direction. The aligned ink chamber configuration finally results in the desired number of nozzles in one row. While FIG. 1*c* illustrates only two such subassemblies, it is understood that this is only done for reasons of clarity. The lateral distance between adjacent nozzles here is much smaller than the lateral distance between neighbouring chambers within each group. In use, ink droplets are ejected or shot out from the nozzles in the x-direction. The x, y and z directions in the drawings refer to an orthogonal system, i.e. the carthesian axes are perpendicular to one another. Also, the addition of further ink chambers 105, 106, etc. in the y-direction is possible in principle and merely limited by economic factors. The inventive principle provides its positive effect, namely the formation of a single row of nozzles having minimum spacing therebetween, even with only two chamber groups 101 and 102.

Figure 2:
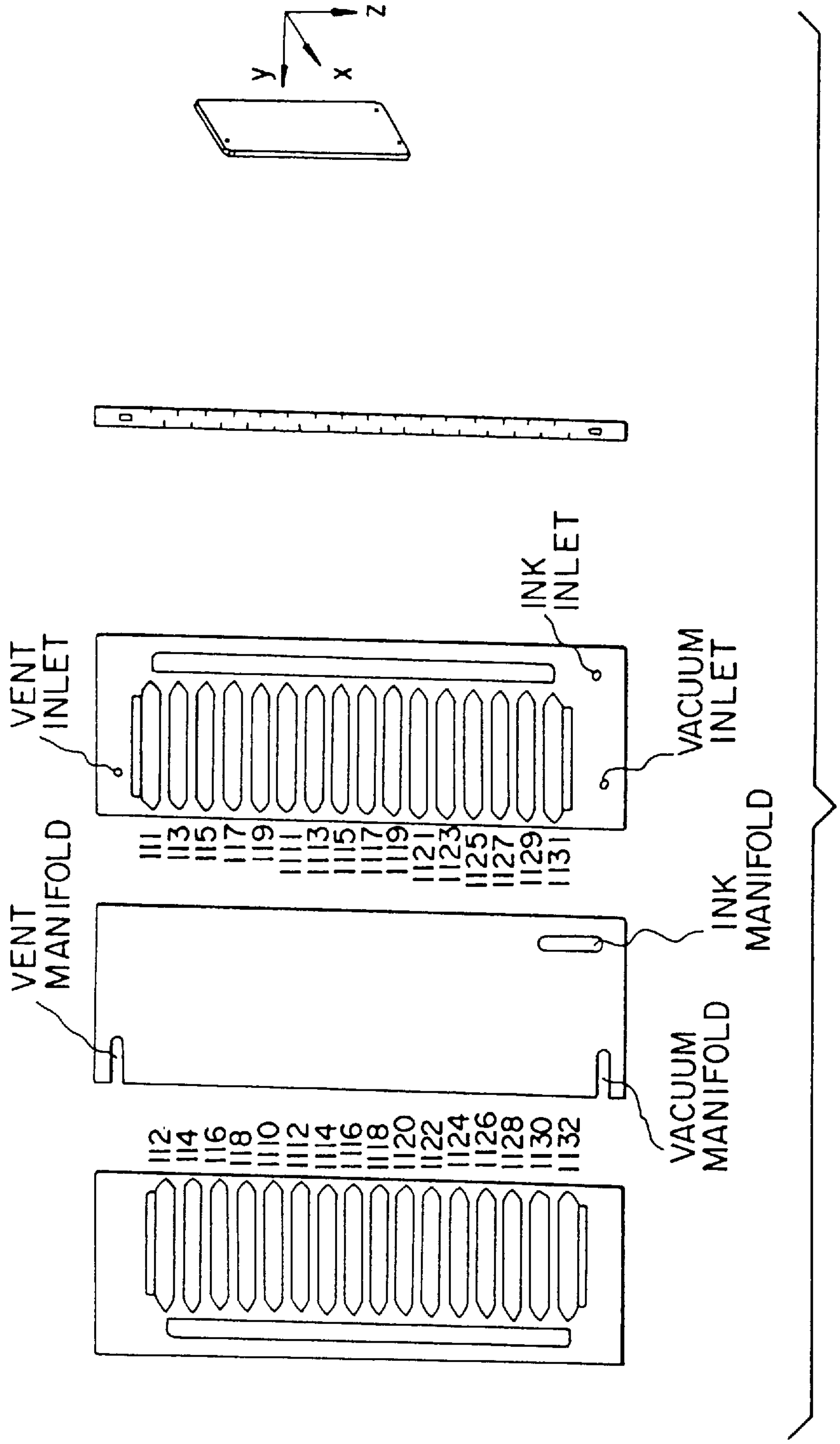
PRIOR ART Fig. 2
FIG. 2 is a diagrammatic, exploded view of a prior art edge-shooter ink jet print head configuration.

Referring now to FIG. 2, a conventional two-row edge-shooter ink jet module configuration consists essentially of three members typically made from ceramic or glass. A first member, which carries a first group of ink chambers on its left-hand side, is connected in the y-direction to a second member, which carries a second group of chambers on its right-hand side. A middle member is sandwiched in between. The alignment is such that the ink chambers are disposed inward facing the middle member and they are staggered in the z-direction along a longitudinal edge. Each chamber is connected to a suction chamber through a first channel and to the face edge of the module through a second channel. Each of the second channels form a nozzle. It is rather difficult to keep the distances between the nozzles of the two rows exactly the same and any differences will produce deviations in the print image through constant timed selection of nozzles in the two rows. This results in poor print quality. The middle chamber has an opening that connects the suction chambers of the first and second members to one another and to an ink supply opening. Additionally, the members are provided. with openings for fastening devices.

Figure 3:
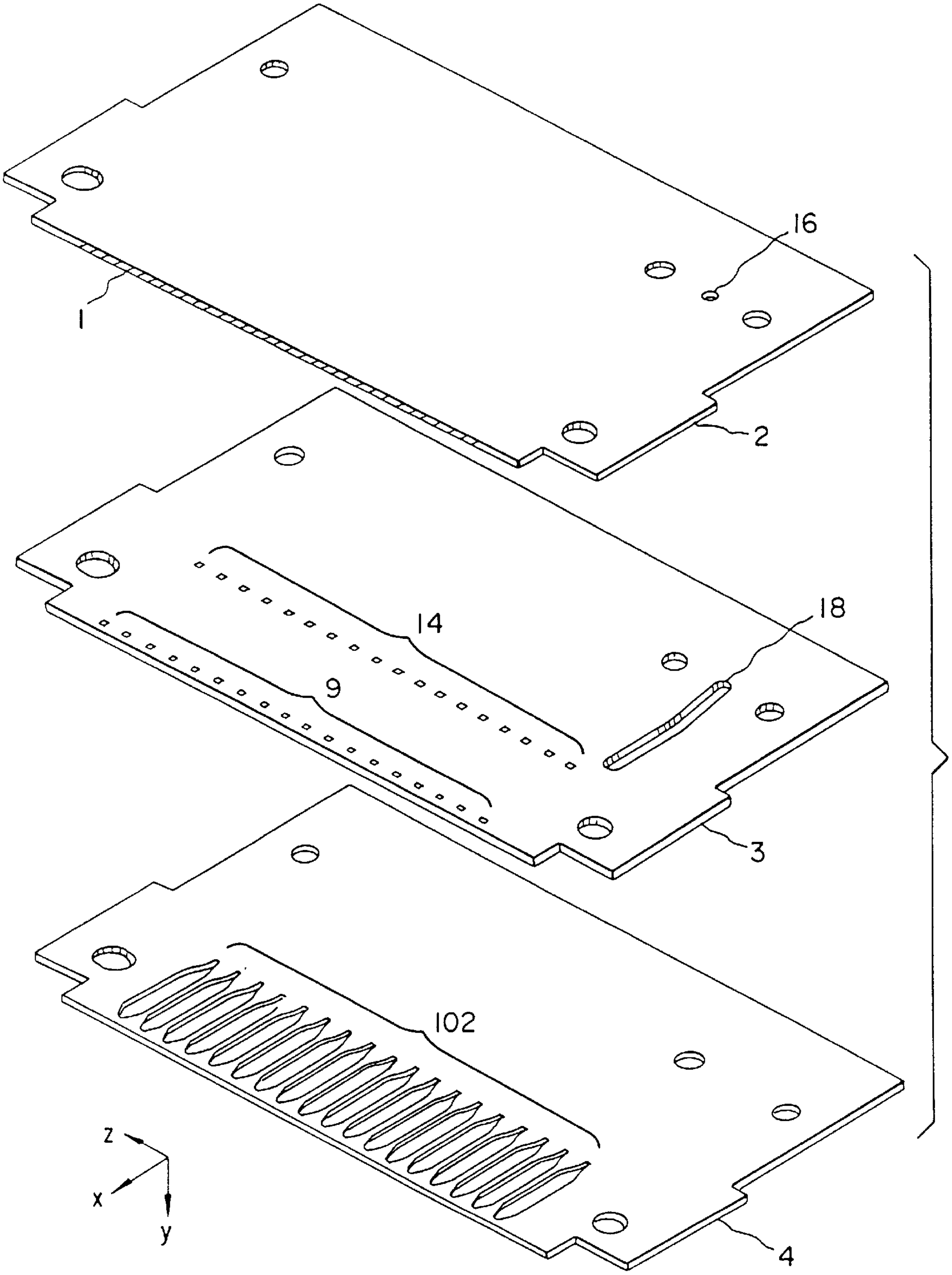
FIG. 3 is an exploded perspective view of a first embodiment of an ESIJIL print head according to the invention.

Referring now to FIG. 3, a module for a first embodiment of the ESIJIL print head (with k=2) consists essentially of three members. A first member 2 carries chambers and all of the nozzles 1. While certain part are referred to as chamber-carrying members, it is understood that they do not "carry" chambers per se, but that chambers or recesses which will form chambers are formed therein. A single row of nozzles 1 is formed. A middle part or center member 3 has a number of second and third openings 14 and 9, in addition to a first opening 18, which effects a communication between the ink supply opening 16 and a suction chamber 15 (not illustrated in FIG. 3). An ink chamber group 101 and the suction chamber 15 are located on the left side of the first member 2, i.e. the underside of 2 which faces the center member 3. A second chamber-carrying member 4 is provided with a second group of ink chambers 102. The ink chambers 102 are supplied with ink via the second openings 14 in the center member 3. The center member 3 is not provided with nozzles. Additional nozzles formed in the first member 2 are connected to the ink chambers 102 of the second member 4 via third openings 9 formed in the center member 3. The members 2–4 are assembled by clamping them in the direction of the y-axis.

Figure 4:
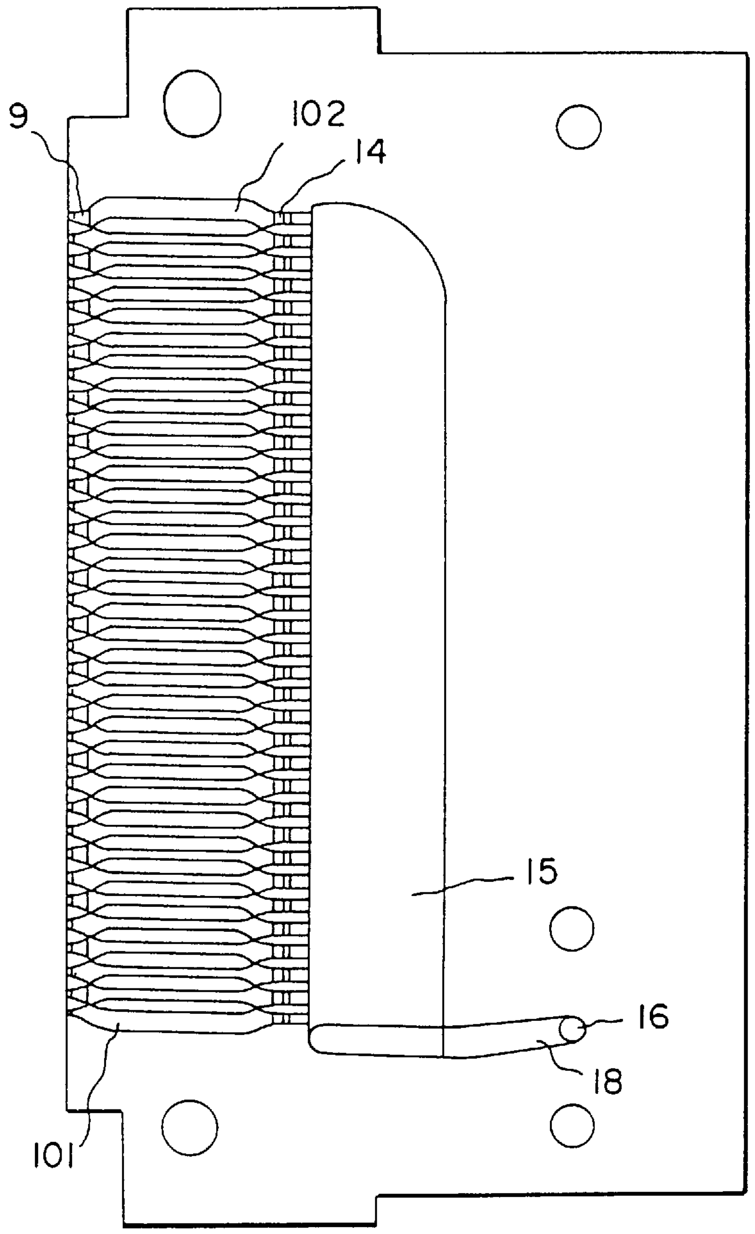
FIG. 4 is a plan X-ray view of the ESIJIL print head of FIG. 3 in an assembled condition.

Referring now to FIG. 4, the X-ray view of the first embodiment of the ESIJIL print head module, in plan view, clearly illustrates the aligned (in-line) configuration of the nozzles and the lateral staggering of the first ink chamber group 101 (formed in the first member 2) relative to the second group of ink chambers 102 (formed in the second member 4). There is also shown the location of the first opening 18 in the center member 3 in communication with the ink supply opening 16 and the suction chamber 15 of the first chamber-carrying member 2. The second openings 14 are connected to the suction chamber 15. The third openings 9 guide the ink to the nozzles of the second nozzle group 1.2. It is provided for the nozzles of the nozzle group 101 to alternate with the nozzles of the nozzle group 102 within the nozzle row.

Referring now to FIGS. 5*a*–5*b*, in which a detail of the X-ray view of FIG. 4 is magnified, the nozzles in the first chamber-carrying member 2 which are associated with the nozzle group 1.1 are assigned to the ink chambers of the first group 101 formed in the same first member 2. From the suction chamber 15, an ink chamber 11 is supplied with ink via a channel 13 (FIG. 5*b*). The nozzles associated with the second nozzle group 1.2 in the first chamber-carrying member 2 are assigned to the chambers 12 of the second ink chamber group 102. The group 102 is formed in the second chamber-carrying member 4, as more clearly seen in the sectional view in FIG. 5*c*. From the suction chamber 15 formed in the first member 2, ink is supplied to the ink chamber 12 of the second member 4 through another channel 13 and through one of the second openings 14 formed in the center member 3. A communicating connection is provided from each chamber 12 to a respective nozzle of the nozzle group 1.2 formed in the first member 2 through a third opening 9 in the center member 3.

Figure 6D:
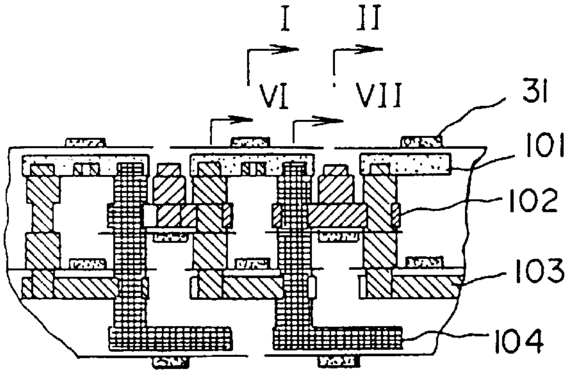
FIG. 6*d* is a sectional X-ray view through the ESIJIL print head of FIG. 6*a;*
Figure 6A:
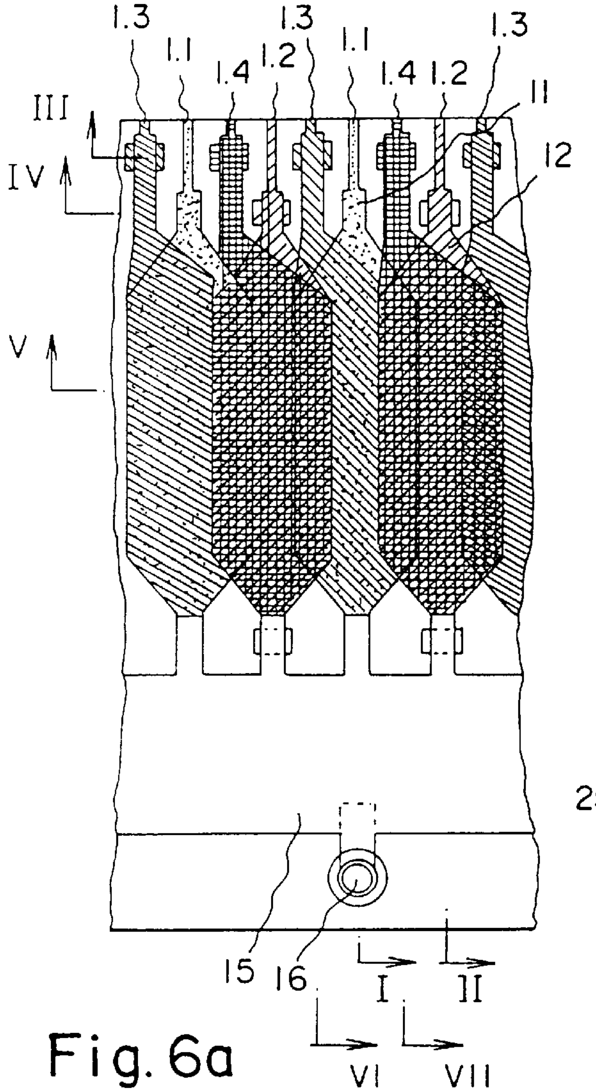
FIG. 6*a* is a partial X-ray view through a second embodiment of the ESIJIL print head according to the invention.
Figures 6B, 6C:
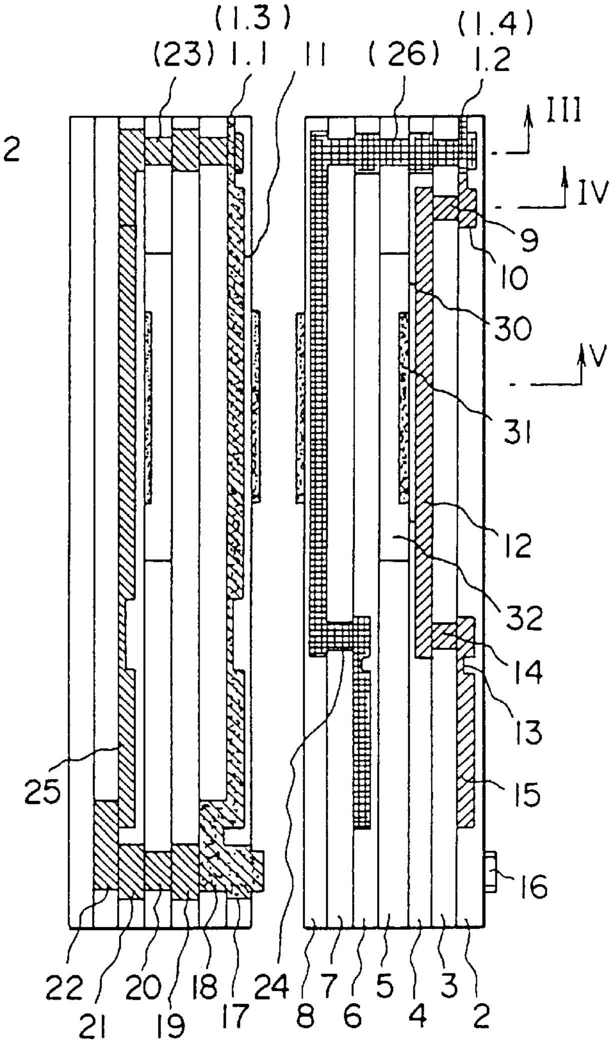
FIG. 6*b* is a sectional view taken along line I—I of FIG. 6*a;*
FIG. 6*c* is a sectional view taken along line II—II of FIG. 6*a;*

FIGS. 6*a*–6*d* pertain to a second embodiment of the ESIJIL print head. FIG. 6*a* illustrates a detail of the print head in an X-ray view. FIG. 6*d* illustrates a front view of the print head in an X-ray view. Details along section lines III—III, IV—IV and V—V are shown overlapped in the view of FIG. 6*d*. From this, together with FIG. 6*a*, the position of the ink chamber groups 101, 102, 103 and 104 becomes clear. FIG. 6*b* shows an overlapping of sections along the lines I—I and VI—VI of FIGS. 6*a* and 6*d*. FIG. 6*c* shows an overlapping of sections taken along lines II—II and VII—VII of FIGS. 6*a* and 6*d*.

The in-line nozzle groups 1.1–1.4 (of k=4 ink chamber groups 101, 102, 103 and 104) are each located in the first member 2. The first member 2 itself has only the chamber 11 of the first ink chamber group 101 of the k=4 chamber groups formed therein. A second nozzle group 1.2 in the first member 2 communicates with a chamber 12 of the second chamber group 102 which is formed in the second chamber-carrying member 4. The second chamber 12 is offset relative to the chamber 11 of the first chamber group 101 in member 2, and is supplied with ink through an opening 14 in the center member 3.

In accordance with the invention, second openings 14 are formed in the center member 3 for supplying ink to the second nozzle group 1.2. Facing the opening 9 in the center member 3 is an opening 10 in the first member 2 and a conduit in the second member 4 exiting each of the chambers 12 of the second chamber group 102, which communicate with the nozzle channels of the second nozzle group 1.2 formed in the first member 2.

The supply of ink to the ink chambers 11 and 12 in the first and second members 2 and 4, respectively, is effected through the common suction chamber 15 formed in the first member 2. Ink is supplied to the suction chamber 15 via openings 16 and 17 in the first member 2, which forms a side part of the print head. The ink is further conducted through an opening 18 formed in the center member 3. Third and forth ink chamber groups 103 and 104 communicate with a further mutual suction chamber 25. The ink is supplied to the suction space 25 from an opening 18 in the center member 3, through an opening 19 in the second member 4, through opening 20 formed in a spacer member 5 or separation member 5, through an opening 21 in a third member 6 (third chamber-carrying member 6), and through an opening 22 in another center member 7. An opening 23 allows the ink from the chamber 25 to reach the nozzle 1.3 (aligned with the nozzle 1.1 in FIG. 6*b*) and an opening 26 allows the ink from the chamber 25 to reach the nozzle 1.4 (aligned with the nozzle 1.2 in FIG. 6*c*).

A piezo-electrical element 31, which is indicated in FIGS. 6*b*–6*d*, is well known in the art as a device to eject ink from a chamber. The element 31 may be disposed on the chamber surface or inside the chamber for placing the required pressure on the liquid ink contained within the chamber. When the piezo-electric member is excited, it applies pressure on the ink chambers through the resilient chamber walls, which results in the ejection of an ink jet from the nozzle communicating with the respective chamber. In the embodiment shown in FIGS. 6*b*–6*d*, the piezo-electrical element 31 is disposed on a surface of each ink chamber. In this case, for example, the ink chamber 12 is separated from the element 31 by a thin layer 30 made of the same material as the second member 4. It is elastic to such an extent that the bending energy (deformation energy) of the element 31 is only negligibly absorbed. Cavities or recesses 32 are formed in the spacer member 5 for receiving the elements 31, such that the latter abut on walls of the adjoining members in the vicinity of ink chambers.

In another advantageous embodiment of the invention, elongated openings may be used in the chamber-carrying members which are connected to respective elongated openings rotated by 90° formed in the center members and the spacer members comprising the print head structure. An ink jet print head configuration of such individual modules will not exhibit tolerance problems or problems associated with machining tolerances accuracy when it is assembled.

Again with reference to FIGS. 6*a*–6*c*, the shape of the openings 10, namely rectangular, make it rather unnecessary to accurately align the various members, as it has been necessary heretofore in the assembly of prior art edge-shooter ink jet print heads. In alternative embodiments, the openings may be shaped as ovals or as tapered holes, where the smallest diameter determines an amount of discharge. Furthermore, the openings 9 and 10 may also be disposed in two rows which run along. the lines III—III and IV—IV.

As seen, the print head module may be structurally built from several sub-modules, in the embodiment of FIG. 6 from two sub-modules. A first such sub-module includes the first member 2 which carries the nozzle row, the third member 4 and the center member 3 sandwiched therebetween. A second sub-module is built from the two chamber-carrying members 6 and 8 and a center member 7 sandwiched therebetween. The chamber carrying members 2, 4, 6 and 8 have the chambers 101, 102, 103, 104, respectively, formed therein. Each sub-module has a suction chamber 15 and 25, respectively, and between the sub-modules there is at least one spacer member 5 which has an ink supply opening 20 and ink lead-through openings 23, 26 assigned to the chambers of the second sub-module. The spacer member 5 further has the recess or cavity 32 for receiving the ejection means 31 for ejecting ink from a chamber. openings 22, 24 and the third openings of the center member 7 communicate with the ink chambers of chamber carrying members 6 and 8 to guide the ink from the respective chambers to the nozzles. Suction chambers 15, 25 of each module are connected to the chambers of the chamber groups 101, 102, 103 and 104 (with k=4) via second openings 14, 24 to supply ink thereto and each module has first openings 18, 22 to provide the ink supply to the suction chambers.

The manufacturing process is based on the presumption that a module is assembled from three members, equipped with piezo-electrical elements and bonded. A second module is attached to the first module via a spacer part 5, and together they form an ESIJIL print head. As mentioned, the second module with the members 6, 7 and 8 is not provided with nozzles, but only respective openings that are connected to the appropriate openings in the members 2, 3 and 4 of the first module.

Figure 7A:
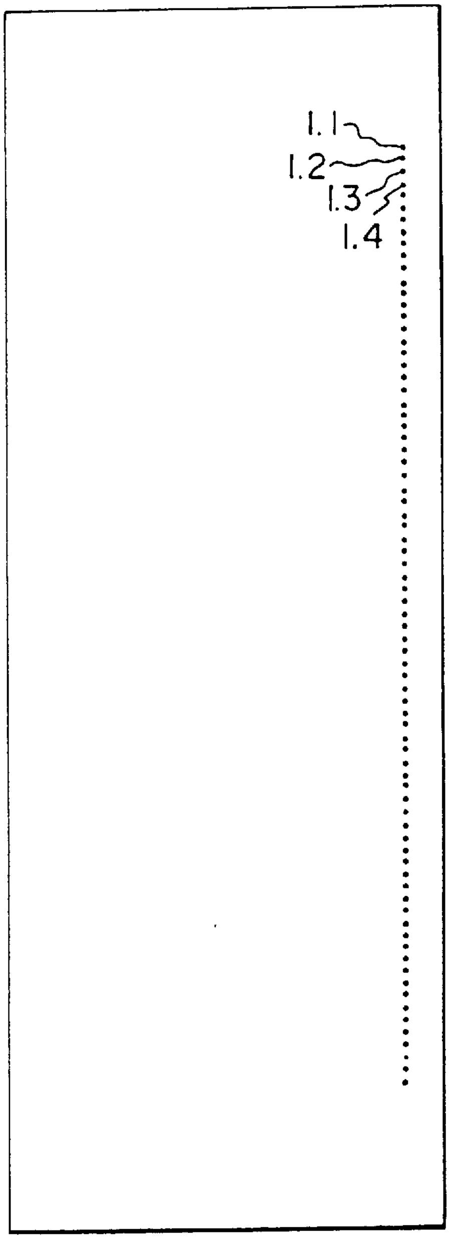
FIG. 7*a* is a front-elevational view of a third embodiment of the ESIJIL print head according to the invention.
Figure 7B:
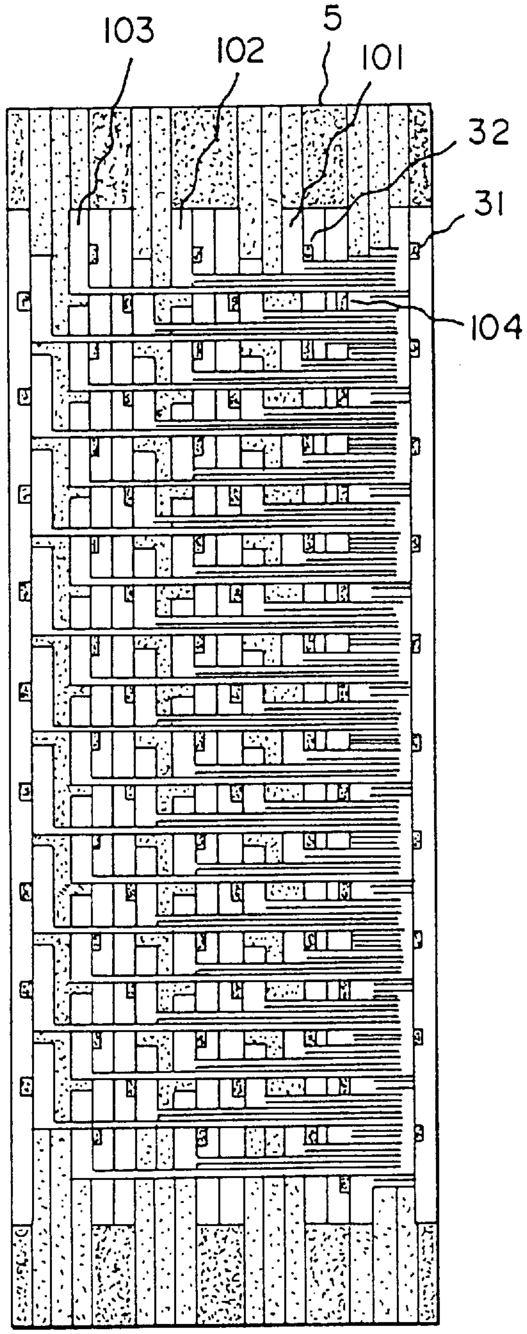
FIG. 7*b* is a sectional X-ray view of the ESIJIL print head of FIG. 7*a*.

Referring now to FIGS. 7*a* and 7*b*, a third embodiment of the ESIJIL print head is configured as a single module with several members. FIG. 7*a* shows is a front view of the print head with an in-line nozzle row and FIG. 7*b* is an X-ray seen from the same angle, with an overlapping of sections taken along lines which correspond to the lines III—III and V—V in FIG. 6. Every third opening lies on the line III—III. Further openings along the line IV—IV are not included. It is quite clearly seen from FIG. 7 that the nozzle density is determined by the dimensions of the nozzles only, i.e. as all of the conduits and chambers may be three-dimensionally displaced in an arbitrary manner, a lack of available volume does not significantly impair a packing density thereof. The nozzles fit in a single row, i.e. they are arranged in a two-dimensional manner. If larger chamber sizes are required, the body of the print head may be increased. Of course, it is also possible if required for higher machining tolerance demands to utilize elongated openings, as illustrated in FIG. 6 on the line III—III.

Unlike the spacer members in FIG. 6, the spacer members in FIG. 7 consist of two parts which are composed of the same material as the piezo-electrical elements (marked in black). These elements are made from the piezo-electric material, which is disposed on the chamber surface, but not on its edge. The cavities 32 are formed only in the direct vicinity of the elements 31. In the edge, ink supply openings as well as second and third openings are cut out. After the piezo-electrical elements are formed, these are bonded, and conductor paths are run on the chamber floors and/or on the outside along the layer 30.

Figure 8:
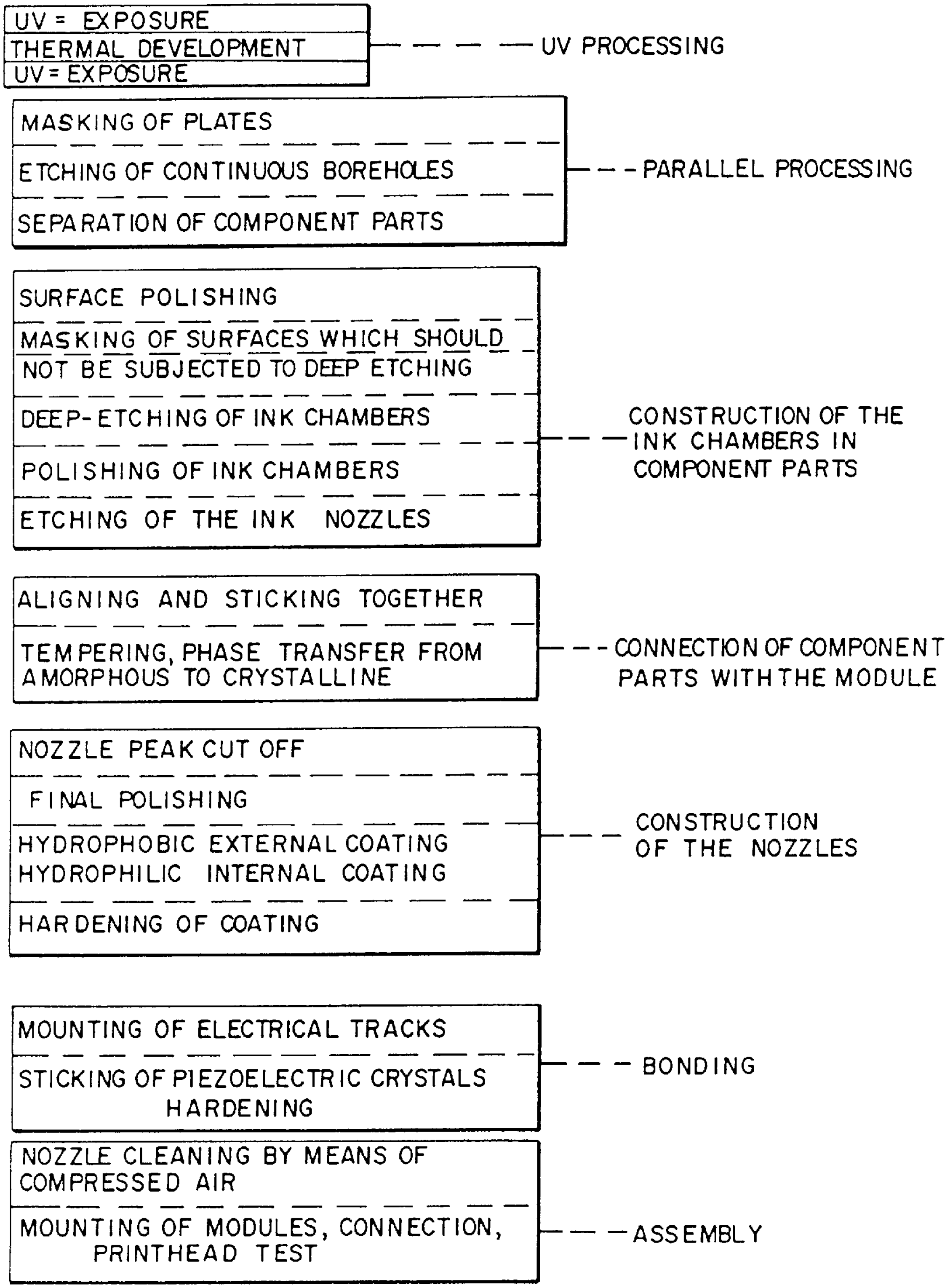
FIG. 8 is a flow chart of the process for manufacturing the ESIJIL print head according to the invention.

In FIG. 8, individual steps of a manufacturing process for preparing the ESIJIL print head according to the invention are shown.

By utilizing masks having the structure of the various parts that are to be manufactured, a photo-sensitive plate or pane of amorphous glass is masked and exposed to UV irradiation. The irradiated areas may then be etched some 100 times faster than non-irradiated areas. Following a heat treatment, there is a further exposure to UV radiation.

The parallel processing steps for several parts of a module include masking and subsequent etching of the continuous openings (ie. through holes).

Next the components are separated, with the completed center members being sorted out.

Before producing the ink chambers, the old mask layer is removed by a precision smoothing of the surface of the chamber parts. Next, the surface is masked in those areas that are not to be depth-etched. After etching the ink chambers, there is another precision smoothing of the components to arrive at final measurements and a further masking for producing the ink supply channels and nozzle channels, which should have a lesser depth than the chambers. Material removal is again effected by etching. In special circumstances, those areas irradiated with UV having more sensitivity are only etched, without the need for a mask.

It is preferred that, for the opening, chamber and channel areas, etchants of different concentrations be used making it possible to remove these respective areas with different accuracies with regard to their depths. The depth accuracy for continuous openings is less than that for very flat areas such as channels in the chamber-carrying members. Etching begins with the continuous openings, then the chambers, and followed by the nozzle channels. It is further preferred, that the thickness of the bottom layer 30 be kept under observation while etching the chambers and that the thickness of the bottom layer 30 of the chambers, which is essential in the formation of the chamber, be obtained by a precision smoothing of each of the chamber-carrying parts.

The components are then aligned and combined into a module. After the components are connected, the module is annealed during which there is a phase transition in the glass material from amorphous to crystalline.

The nozzle tips are cut by means of a rotary disc cutter to obtain a straight edge face. A smooth surface is obtained with a final precision smoothing.

By flushing with a first, suitable liquid common in the trade, a hydrophilic inner coating is created. Then by treating the edge face with a second, suitable liquid, a hydrophobic outer coating is obtained. After hardening the upper layer, the nozzles are completed.

Application of electric conductor paths onto the chamber surface, application of the piezo crystals, and bonding is effected in a conventional manner. The piezo crystals may be individually affixed, with a subsequent hardening. Alternatively, a layer of piezo-electrical material may be applied, which is then structured and bonded, onto the chamber surface. Application of the layer may be done by a sputtering process, for instance.

As a final step, compressed air is used to cleanse the nozzles.

In another method for the manufacturing process, the production of the chambers and the continuous openings in the components may occur in a single step. For that purpose, it is necessary to repeat the UV irradiation through different masks, before the glass plate is etched. Another possibility is to vary the intensity of. UV irradiation. Accordingly, the glass plate has a varying sensitivity in different areas when it is etched. The dividing line between the various parts is also etched, which simplifies a later separation. The mask to be used in the process has open areas for both the chambers and the continuous openings. After etching, a precision smoothing to final specifications is effected, to obtain a desired thickness for the layer. 30 on the chamber floor. The production of the ink nozzles and of the piezo-electrical elements as well as the production of the edges, is effected in the conventional manner as mentioned above. In this embodiment, the chamber floor is used for bonding. Then, the plate is separated and divided up into components that are then arranged as a module.

In yet another variant of the method, the back of the chamber surface may also or only be equipped and bonded with piezo-electrical elements. With bonding before separating, it is advantageous that the center members also may be equipped with conductor paths. Thus, a conductor leading from the other layers to the upper layer of the module may be obtained without crossovers, even if a large number of components are to be bonded. The module components are aligned, fixed together and annealed which causes the phase transition from amorphous to crystalline. It is preferred, that spacer members lie between respective modules arranged in a multi-module print head, and that the spacer members are made of the same plate material or of a layer of piezo-electrical material applied to the surface of the plate, which is then structured by etching. A print head may consist of several modules or only a single module having conductor paths, which are bonded externally, leading to the outside. The print head is finally arranged in a casing, and may be tested for operability to detect defective models. In another embodiment, the plate material or one of its components may consist of a photo-sensitive ceramic. Glass parts and/or ceramics parts may also be fixed to each other by an adhesive connection.

The foregoing is a description corresponding in substance to German Application P 42 25 799.9, dated Jul. 31, 1992, the International priority of which is being claimed for the instant application, and which is hereby made part of this application. Any material discrepancies between the foregoing specification and the aforementioned corresponding German application are to be resolved in favor of the latter.

We claim:

1. A method of manufacturing an ink jet print head having a plurality of different members, which comprises the steps of:

producing a plurality of different members by parallel processing individual plates including a first chamber-carrying member, a center member, and a second chamber-carrying member;

forming orifices including through openings in the first chamber-carrying member, the center member, and the second-chamber carrying member via masking and etching processes;

forming chambers in the first chamber-carrying member and the second chamber-carrying member via masking and etching processes;

forming nozzle openings in at least one of the first chamber-carrying member, the center member and the second chamber carrying member via masking and etching processes;

connecting the first chamber-carrying member and the second chamber-carrying member to the center member by annealing for forming at least one print head module; and applying at least one conductor path and piezo-electrical elements to the at least one print head module and electrically connecting the piezo-electrical elements with the at least one conductor path applied to the at least one print head module for forming an ink jet print head.

2. The method according to claim 1, which comprises, prior to the processing step, preparing masks and pretreating the individual plates by removing from the individual plates areas for the chambers including ink chambers and suction chambers, for the nozzle openings, and for the through openings including supply conduits, by exposing the individual plates to ultraviolet radiation and subsequently heat-treating, and then etching areas of the individual plates from which material is to be removed.

3. The method according to claim 2, which comprises, in the pretreating step, exposing all areas from which material is to be removed to ultraviolet light of substantially identical wavelength and intensity, applying a first mask to the plate prior to etching photo-sensitized areas of the plate, etching first areas of the plate, subsequently removing the first mask, subsequently applying a second mask and etching second areas of the plate, subsequently removing the second mask and etching third areas of the plate.

4. The method according to claim 3, which comprises using etchant of respectively different concentrations in etching the first, second and third areas, for removing material from the areas with respectively different depth accuracy, and choosing a relatively lower depth accuracy for etching the through openings as compared to etching very flat areas for ink channels in the chamber-carrying members, and etching the through openings first, etching the chambers second, and etching the nozzle openings third.

5. The method according to claim 2, which comprises, in the pretreating step, applying different masks on the individual plates, exposing given areas of the plate to more frequent and/or more intense ultraviolet radiation of a given wavelength than other areas of the plate for creating areas of different sensitivity to the etchant, applying masks with regard to areas where plate material is to be removed to different depths, and using an etchant of a certain concentration in the etching step.

6. The method according to claim 1, which comprises, performing an etching step and continuously observing a thickness of a floor layer of chambers of the chamber-carrying members being etched, and subsequently precision smoothing the chamber-carrying members for obtaining a final thickness of the floor layers of each of the etched-out chambers.

7. The method according to claim 1, which comprises, subsequently to the processing step, separating individual components including the first chamber-carrying member, the center member and the second chamber-carrying member from the plate and further processing the individual components separately.

8. The method according to claim 7, which comprises, subsequently to etching through openings in all components, separating the components, precision smoothing surfaces of the chamber-carrying members, masking given areas of the surfaces of the chamber-carrying members, and depth etching areas of the surfaces which are not masked, forming recesses and/or ink chambers in the chamber-carrying members, precision smoothing at one surface for obtaining a desired depth of the ink chambers, and precision smoothing at an opposite surface for exactly adjusting a desired thickness of a floor layer of the ink chamber, removing the mask used in the depth etching step by means of precision smoothing, and finally etching the ink nozzles.

9. The method according to claim 8, which comprises, in the etching of the ink nozzles, removing essentially only photo-sensitive plate material.

10. The method according to claim 8, which comprises applying a third mask prior to the etching of the ink nozzles.

11. The method according to claim 1, which comprises photo-sensitizing given areas of the individual plates to respectively different degrees of etching sensitivity, subsequently forming recesses, chambers and through openings concurrently in one step at different etching speeds caused by the different sensitivity of the respective areas, then separating the plate into components after a required depth of the recesses and chambers is obtains, and subsequently etching ink nozzle openings into individual chamber members.

12. The method according to claim 11, which includes etching dividing lines into the plate for simplifying the separation of the plate into the components.

13. The method according to claim 1, which comprises etching nozzle openings into a chamber-carrying member, arranging individual plate parts including chamber-carrying members and center members into a module, aligning the components, durably affixing the components to one another, cutting an edge face of the module into which the nozzle openings formed and subsequently precision smoothing the edge face for creating an even surface along the edge face with the nozzle openings, applying a hydrophilic inner film on surfaces of cavities formed in the module by flushing the cavities with a first liquid, applying a hydrophobic outer film on even surfaces along the edge face with the nozzle openings, and subsequently hardening the inner and outer films.

14. The method according to claim 13, which comprises providing a plate material for forming the components of amorphous, photo-sensitive glass, annealing the components in the durably affixing step and chosing a temperature in the annealing step which causes a phase transition in the glass from amorphous to crystalline.

15. The method according to claim 13, which comprises, subsequently to the applying steps, attaching piezo-electrical elements including piezo electric crystals to at least one of a base of the chambers formed in the module and an outer surface of a bottom layer of the chambers formed in the module, and electrically connecting the piezo-electric crystals.

16. The method according to claim 15, which comprises affixing the piezo-electric crystals with an adhesive and hardening the adhesive connection.

17. The method according to claim 15, which comprises sputtering conductor tracks on the chamber carrying members in the electrically connecting step.

18. The method according to claim 15, which comprises sputtering a piezo-electric layer onto the chamber-carrying members in the attaching step, and structuring the piezo-electric layer.

19. The method according to claim 15, which compresses applying electric conductor paths onto the center members for obtaining crossover-free conductor paths.

20. The method according to claim 1, which comprises assembling individual modules with at least one spacer member disposed therebetween to form an ink jet print head, mounting the ink jet print head in a casing and providing electrical connections to the ink jet print head.

21. The method according to claim 20, which comprises producing the at least one spacer member by applying a layer of piezo-electric material on a surface of the plate, and structuring the layer of piezo-electric material by means of etching.

22. The method according to claim 20, which comprises producing the at least one spacer member from the individual plates.

23. The method according to claim 22, which comprises producing the at least one spacer member from the individual plates during the parallel processing step and prior to separating the components.

24. The method according to claim 1, which comprises assembling an ink jet print head from a plurality of chamber-carrying members and center members, mounting the ink jet print head in a casing and providing electrical connections to the ink jet print head.

25. The method according to claim 24, which comprises forming nozzle openings in one of the chamber-carrying members, and cleansing the nozzle openings with compressed air subsequently to assembling the ink jet print head.

26. The method according to claim 24, which comprises operatively testing the assembled ink jet print head and separating out defective ink jet print heads.

27. The method according to claim 1, which comprises forming nozzle openings in one of the chamber-carrying members, and cleansing the nozzle openings with compressed air subsequently to forming the print head module.

28. The method according to claim 1, which comprises performing the processing step with a photo-sensitive ceramic material and providing a second individual plate composed of photo-sensitive, amorphous glass, forming at least one component of the module of the glass material, and assembling the module with adhesive.

29. The method according to claim 1, which comprises performing the processing step with a photo-sensitive ceramic material and providing a second individual plate composed of photo-sensitive, amorphous glass, forming at least one component of the module of the ceramic material, and assembling the module with adhesive.

30. A method of manufacturing an ink jet print head having a plurality of different members, which comprises the steps of:

producing a plurality of different members by parallel processing individual plates including a first chamber-carrying member, a center member, and a second chamber-carrying member;

forming orifices including continuous openings, chambers and recesses in the different members, carrying out the forming step by removing and applying masks at areas where plate material is to be removed to form different depths in the different members, by etching with an etchant of a given concentration;

connecting the first chamber-carrying member and the second chamber-carrying member to the center member by annealing for forming at least one print head module; and applying at least one conductor path and piezo-electrical elements to the at least one print head module and electrically connecting the piezo-electrical elements with the at least one conductor path applied to the at least one print head module forming an ink jet print head.

31. A method of manufacturing an ink jet print head having a plurality of different members, which comprises the steps of:

producing a plurality of different members by parallel processing individual plates including a first chamber-carrying member, a center member, and a second chamber-carrying member;

removing and applying masks to the different members formed from the individual plates and depth etching those areas of the different members which are not masked using an etchant of a given concentration to remove different layers of plate material to form continuous openings, ink chambers, chambers and recesses in the different members in a single main step;

separating the individual plates forming the first chamber-carrying member, the center member and the second chamber-carrying member from each other;

connecting the first chamber-carrying member and the second chamber-carrying member to the center member by annealing forming at least one print head module; and applying at least one conductor path and piezo-electrical elements to the at least one module and electrically connecting the piezo-electrical elements with the at least one conductor path applied to the at least one print head module forming an ink jet print head.

32. A method of manufacturing an ink jet print head having a plurality of different members, which comprises the steps of:

producing a plurality of different members by parallel processing individual plates including a first chamber-carrying member, a center member, and a second chamber-carrying member;

removing and applying masks to the different members formed from the individual plates and depth etching those areas of the different members which are not masked using an etchant of a given concentration to remove different layers of plate material to form continuous openings, chambers and recesses in the different members;

applying at least one conductor path and piezo-electrical elements to the different members and electrically connecting the piezo-electrical elements with the at least one conductor path;

separating the individual plates forming the first chamber-carrying member, the center member and the second chamber-carrying member from each other; and adhering the first chamber-carrying member and the second chamber-carrying member to the center member by an adhesive forming an ink jet print head.

33. A method of manufacturing an ink jet print head having a plurality of different members, which comprises the steps of:

producing a plurality of different members by parallel processing individual plates including a first chamber-carrying member, a center member, and a second chamber-carrying member;

forming through openings in the first chamber-carrying member, the center member and the second chamber-carrying member, via masking and etching processes;

separating and dividing up the individual plates from each other into the first chamber-carrying member, the center member and the second chamber-carrying member;

forming at least one chamber in the first and second chamber-carrying members, with forming steps which include masking, etching, and precision smoothing processes;

carrying out the masking step by removing an old mask layer and applying a new mask to the first and second chamber-carrying members which have the structure of the at least one chamber;

carrying out the etching step by exposing a photosensitive plate of amorphous glass to UV radiation and then etching the irradiated glass areas using an etchant of a certain concentration, where plate material is to be removed to different depths;

carrying out the precision smoothing steps until a final depth is achieved;

connecting the first chamber-carrying member and the second chamber-carrying member to the center member by annealing forming at least one print head module;

forming a nozzle tip having a nozzle opening by cutting nozzles in one of the different members, carrying out the cutting step to form the nozzle tips with a straight edge face and performing a final precision smoothing and cleaning of the nozzle tips; and applying at least one conductor path and piezo-electrical elements to the at least one print head module and electrically connecting the piezo-electrical elements with the at least one conductor path applied to the at least one print head module forming an ink jet print head.

* * * * *